US006995458B1

(12) United States Patent
Hashemi

(10) Patent No.: US 6,995,458 B1
(45) Date of Patent: Feb. 7, 2006

(54) CAVITY DOWN NO LEAD PACKAGE

(75) Inventor: Hassan S. Hashemi, Laguna Niguel, CA (US)

(73) Assignee: Mindspeed Technologies, Inc., Newport Beach, CA (US)

( * ) Notice: Subject to any disclaimer, the term of this patent is extended or adjusted under 35 U.S.C. 154(b) by 0 days.

(21) Appl. No.: 10/870,266

(22) Filed: Jun. 17, 2004

(51) Int. Cl.
*H01L 23/495* (2006.01)

(52) U.S. Cl. .................... 257/666; 257/675; 257/676; 257/696

(58) Field of Classification Search ............... 257/666, 257/675, 676, 696
See application file for complete search history.

(56) References Cited

U.S. PATENT DOCUMENTS 6,730,544 B1 * 5/2004 Yang ........................ 438/110

* cited by examiner

Primary Examiner—Thien F. Tran
(74) Attorney, Agent, or Firm—Farjami & Farjami LLP

(57) ABSTRACT

An IC package includes a leadframe disposed within a mold body. A paddle is situated substantially on a first mold body surface. An outer paddle surface is substantially exposed for dissipating heat. A semiconductor die is coupled onto an inner paddle surface. A first portion of leads is formed against a side surface of the mold body for coupling to a PCB placed against a second mold body surface opposite to the first mold body surface. The footprint of the IC package is substantially coextensive with the footprint of the mold body. In another embodiment, an IC package includes a heat spreader having a semiconductor die attach area on an inner heat spreader surface between a first heat spreader end and a second heat spreader end. The heat spreader has insulator elements coupled to the ends of the heat spreader. The insulator elements can have bonding areas thereon.

15 Claims, 3 Drawing Sheets

CAVITY DOWN NO LEAD PACKAGE

BACKGROUND OF THE INVENTION

1. Field of the Invention

The present invention is generally in the field of semiconductor manufacturing. More specifically, the invention is in the field of semiconductor die packaging.

2. Background Art

Leadframe based molded packages are commonly used in semiconductor packaging. As a part of efforts to reduce the inductance values on the ground connection of the semiconductor die, an "exposed paddle" leadframe based molded package has been developed. In an exposed paddle leadframe based molded package, the bottom surface of the paddle is not encapsulated in mold compound. The metal on the bottom surface of the paddle is left exposed in order to electrically connect the bottom surface of the paddle to a printed circuit board ("PCB") ground during a re-flow solder process.

Unfortunately, this conventional approach is not suitable for some applications when it comes to heat dissipation. For example, in some laser driver optical head applications heat cannot flow from the semiconductor die, down through the paddle, and into the PCB, because an optical laser is in the thermal path. Conventional approaches have existed wherein the electrical connections and primary thermal path (i.e. heat dissipation path out of the semiconductor die) are both on the same side of the package, i.e. heat is spread from the semiconductor die down into the PCB where the electrical connections are made.

Thus, it would be desirable to dissipate heat from one side of an IC package and provide electrical connections from the opposite side of the IC package in certain applications. One could envision providing thermal vias within the IC package, leading from the semiconductor die to the surface of the IC package on the opposite side of the IC package as the electrical connections. However, formation of such thermal vias within the mold body would be quite difficult, slow, and expensive.

In addition to the problems with conventional approaches mentioned herein, some previous attempts exhibit outer leads that extend further than necessary from the sides of the IC package. These IC packages have relatively large footprints, which is typically undesirable. Large footprints are especially undesirable for area-challenged consumer communication, gaming, hand-held applications, and the like.

Thus, it is seen that there is need in the art for a leadframe molded package with a relatively small footprint. The leadframe molded package should exhibit improved heat dissipation characteristics from one surface and have electrical connections emanating from an opposite surface of the package. The IC package should also allow for efficient and cost-effective manufacturing.

SUMMARY OF THE INVENTION

The present invention is directed to a cavity down no lead package. The invention overcomes the need in the art for a leadframe molded package with a relatively small footprint and exhibits improved heat dissipation characteristics from one surface of the package and has electrical connections emanating from an opposite surface of the package. The invention also results in efficient and cost-effective manufacturing.

According to one embodiment of the invention, an IC package includes a leadframe disposed within a mold body. A paddle is situated substantially on a first mold body surface. An outer paddle surface is substantially exposed for dissipating heat. A semiconductor die is coupled onto an inner paddle surface. A first portion of leads is formed against a side surface of the mold body for electrical coupling to a PCB placed against a second mold body surface opposite to the first mold body surface. The footprint of the IC package is substantially coextensive with the footprint of the mold body. In one implementation of this embodiment, the outer paddle surface is coupled to an external heat spreader.

According to another embodiment of the invention, an IC package includes a heat spreader having a semiconductor die attach area on an inner heat spreader surface between a first heat spreader end and a second heat spreader end. The heat spreader can be a copper slug, for example. The heat spreader has insulator elements, such as flex tape, coupled to the ends of the heat spreader. The insulator elements can have bonding areas thereon.

Other features and advantages of the present invention will become more readily apparent to those of ordinary skill in the art after reviewing the following detailed description and accompanying drawings.

DETAILED DESCRIPTION OF THE INVENTION

The present invention is directed to a cavity down no lead package. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely example embodiments of the invention. To maintain brevity, other embodiments of the invention which use the principles of the present invention are not specifically described in the present application and are not specifically illustrated by the present drawings.

Figure 1:
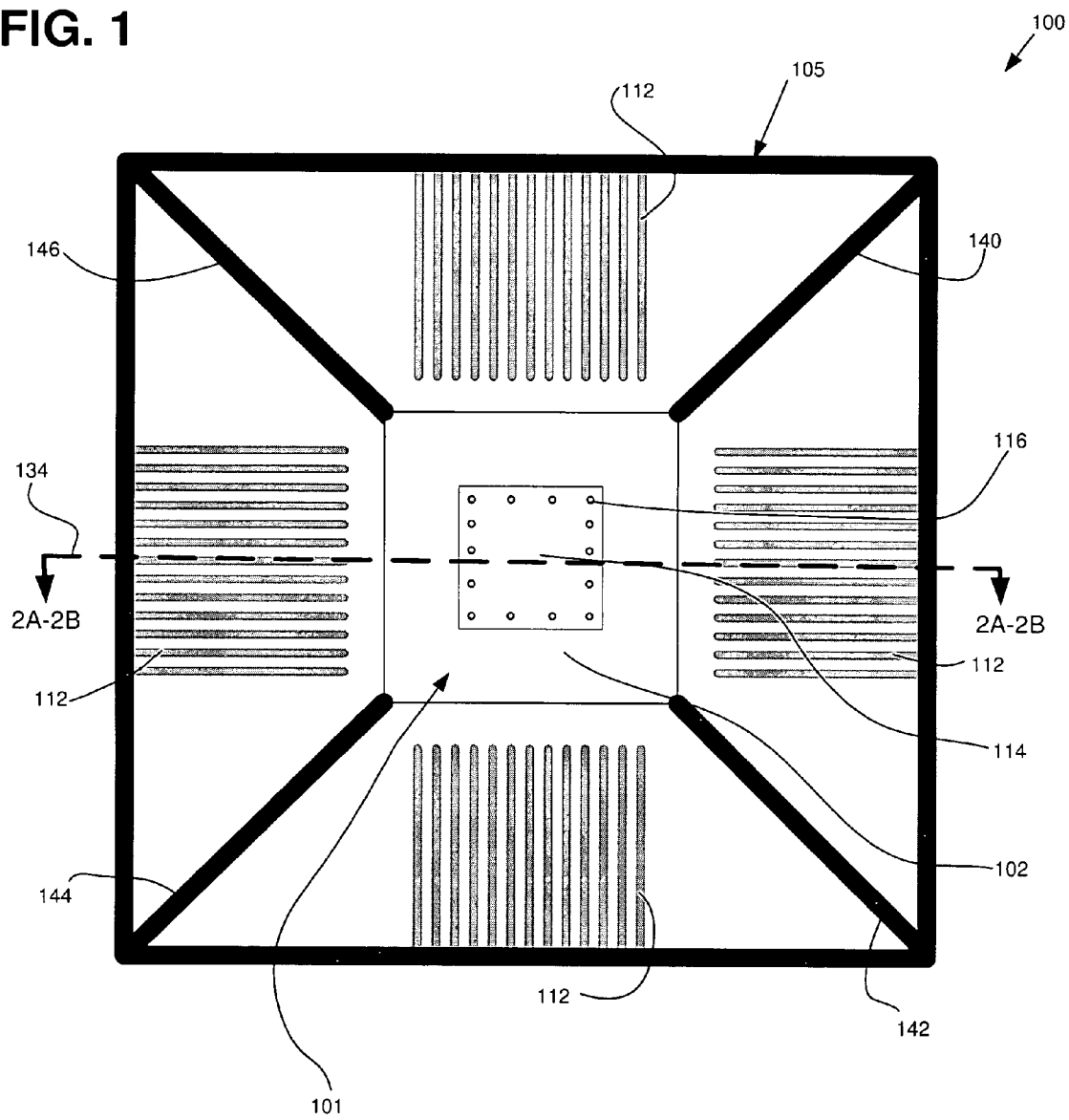
FIG. 1 illustrates a view of a leadframe according to one embodiment of the invention.

FIG. 1 illustrates a view of leadframe 100 according to one embodiment of the invention. Paddle 102 of leadframe 100 is attached to the remainder of leadframe 100 by four tie bars 140, 142, 144, and 146. An inner paddle surface 101 of paddle 102 is shown. Tie bars 140, 142, 144, and 146 are attached to dam bar 105 of leadframe 100. A number of inner leads 112 are situated on the four sides of leadframe 100. Semiconductor die 114 is attached onto inner paddle surface 101 of paddle 102 on leadframe 100. Bond wires (not shown in any of the figures) have first ends bonded to respective bonding pads 116. Second ends of the bond wires are bonded to respective inner leads 112.

In the present leadframe based molded package, the outer surface of paddle 102 is not encapsulated in mold compound and is exposed for use as, or coupling to, a heat spreader or the like. The exposed paddle leadframe 100 of the present invention is a "cavity down" leadframe (used to form a cavity down IC package) since leadframe paddle 102 is set at a plane different from the plane of leadframe 100 so that the outer surface of paddle 102 is not covered by mold compound that is applied to the leadframe during manufacturing. As such, the outer surface of paddle 102 remains exposed for advantageously dissipating heat away from semiconductor die 114.

Figure 2A:
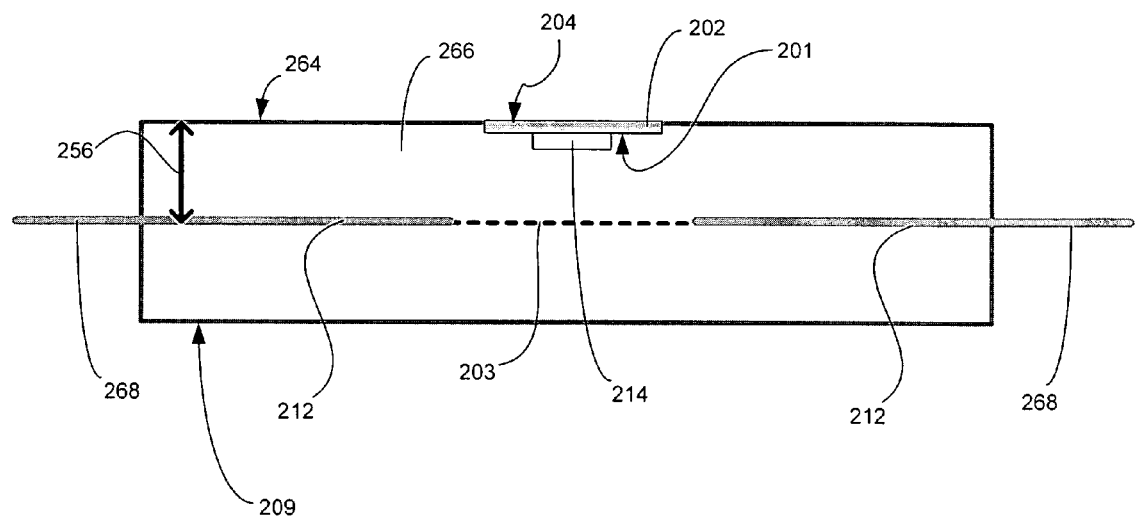
FIG. 2A illustrates a cross section view of a leadframe encapsulated in mold compound in a mold cavity.

FIG. 2A illustrates a cross section view of leadframe 100, formed according to an embodiment of the present invention. The cross section taken is shown in FIG. 1 by line 2A–2B, also referred to by numeral 134. As stated above, leadframe 100 is a cavity down leadframe. In other words, leadframe 100 has undergone a mechanical forming process whereby paddle 202 is set above plane 203 in which the remainder of leadframe 100 resides. The offset value, i.e. the initial vertical distance between the plane of paddle 202 and plane 203, is indicated by numeral 256 in FIGS. 2A and 2B.

In the present embodiment, leadframe 100 includes semiconductor die 214 attached to inner paddle surface 201 of paddle 202. After semiconductor die 214 is attached to inner paddle surface 201, bond wires are bonded between semiconductor die 214 and leadframe 100. A given bond wire has a first end bonded to a respective die bonding pad, such as bonding pad 116 on semiconductor die 214. A second end of a given bond wire is bonded to a respective inner lead 212 of leadframe 100. It is noted that inner paddle surface 201, paddle 202, inner leads 212, and semiconductor die 214 correspond, respectively, to inner paddle surface 101, paddle 102, inner leads 112, and semiconductor die 114.

Referring again to FIG. 2A, paddle 202 is situated substantially on first mold body surface 264 of mold body 266. Leadframe 100 is disposed within mold body 266. Outer paddle surface 204 is exposed for advantageously dissipating heat from semiconductor die 214. Outer paddle surface 204 is substantially flush with first mold body surface 264. Semiconductor die 214 is coupled to inner paddle surface 201. Inner leads 212 are disposed within mold body 266. Inner leads 212 electrically couple semiconductor die 214 to outer leads 268.

Figure 2B:
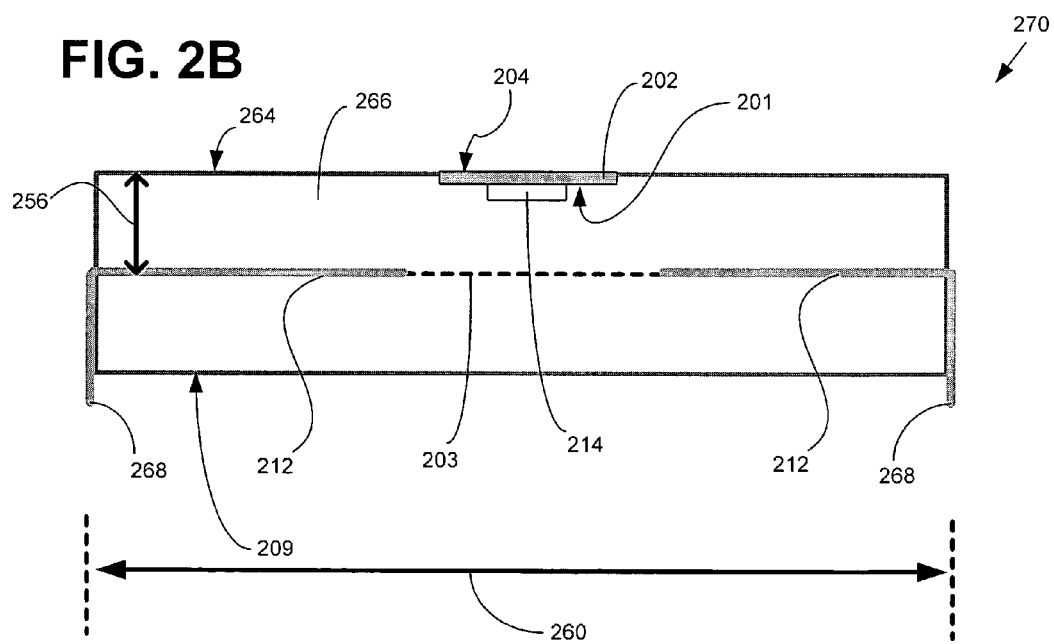
FIG. 2B illustrates a cross section view of an IC package, having a leadframe, after leads extending out of the IC package have been formed downward against a side surface of the IC package according to one embodiment of the invention.

Referring to FIG. 2B, outer leads 268 extending out of IC package 270 are leadformed (i.e. formed) downward substantially flush against and substantially tangent with the sides of mold body 266. In other words, outer leads 268 are bent downward and pressed against the sides of IC package 270.

Outer leads 268 are also cut to a desired length. Outer leads 268 extending out of IC package 270 can be formed into "butt leads" or "J leads" as known in the art. It is also contemplated that outer leads 268 can be formed into any other suitable configuration. Outer leads 268 can then be connected (e.g. soldered down) to various signals, ground, or the like on a PCB typically situated directly below second mold body surface 209 in FIG. 2A (the PCB is not shown in any of the figures). As shown in FIG. 2B, outer leads 268 are bent downward from IC package 270 and away from first mold body surface 264 of mold body 266, against an outside surface of mold body 266, for coupling to a PCB or the like. The PCB is typically situated against second mold body surface 209.

Advantageously, in one embodiment, outer leads 268 protrude laterally from the sides of IC package 270 a short distance (e.g. approximately 1 millimeter) from each side. Consequently, footprint 260 of IC package 270 is substantially coextensive with (e.g. only approximately 2 millimeters greater than) the footprint of IC package 270 without outer leads 268. In other words, footprint 260 of IC package 270 is substantially coextensive with a footprint of mold body 266. Conventional approaches, on the other hand, typically exhibited IC package footprints significantly wider than their respective mold bodies.

It is noteworthy that in other embodiments outer leads 268 protrude laterally from the sides of IC package 270 a distance more or less than one millimeter from each side. A smaller footprint 260 is desirable for various reasons, such as for allowing each IC package 270 to take up less space on a PCB, and for increasing the number of IC packages that can be included in a given area on a PCB, for example.

It is further noteworthy that paddle 202 can work alone as a heat spreader or in conjunction with an additional heat spreader. For example, in one embodiment according to the present invention, an external heat spreader might be placed against top surface 264 of mold body 266 to even further enhance the heat dissipation capability of IC package 270. In other words, an external heat spreader might be disposed against and thermally coupled to exposed outer paddle surface 204. Thus, although outer paddle surface 204 can itself function as an effective heat spreader, an external heat spreader attached to exposed outer paddle surface 204 can even further enhance the heat dissipation capability of IC package 270. Therefore, a thermal path exists between semiconductor die 214 and outer surface 264 of mold body 266, or top surface of IC package 270. Consequently, a thermal path leads through the top of IC package 270, while electrical connections emanate in the opposite direction from the opposite side of IC package 270.

Embodiments according to the present invention thus allow for heat dissipation from one surface of IC package 270 while allowing for electrical connections from the opposite surface of IC package 270, and simultaneously allow for a relatively small footprint substantially coextensive with what the footprint of IC package 270 would be without outer leads 268. Thus, IC package 270 is surface-mountable, wherein heat can be efficiently removed from one surface, e.g. the top surface, and signal connections can emanate from the other surface, e.g. the bottom surface, of the IC package. This design is especially useful in, for example, high power dissipation applications where it is desired to divert heat away from optical lights where the PCB is located.

It should be borne in mind that, unless noted otherwise, like or corresponding elements among FIGS. 2A and 2B are indicated by like or corresponding reference numerals.

Figure 3:
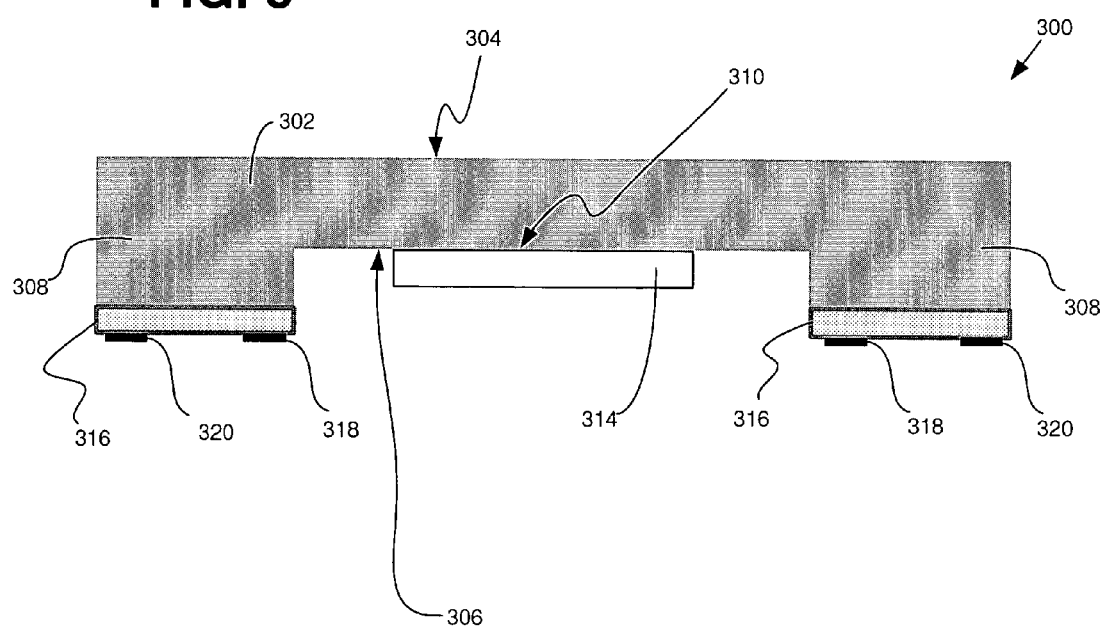
FIG. 3 illustrates a cross section view of an IC package according to another embodiment of the invention.

FIG. 3 depicts IC package 300 comprising heat spreader 302 according to another embodiment of the present invention. Heat spreader 302 has outer heat spreader surface 304 and inner heat spreader surface 306. Heat spreader 302 further includes first and second heat spreader ends 308. In one embodiment, heat spreader 302 comprises a copper slug. However, heat spreader 302 can be formed from other suitable materials. Semiconductor die attach area 310 is located on inner heat spreader surface 306 between heat spreader ends 308. Outer heat spreader surface 304 is substantially exposed for dissipating heat from semiconductor die 314 in conjunction with inner heat spreader surface

306 and heat spreader 302. Semiconductor die 314 is coupled to inner heat spreader surface 306 at semiconductor die attach area 310.

Insulator elements 316 are coupled to respective heat spreader ends 308. Insulator elements 316 have first bonding areas 318 for coupling to semiconductor die 314 via bond wires or the like. In one embodiment, insulator elements 316 are formed from flex tape. Insulator elements 316 can be formed from other suitable materials as well. Insulator elements 316 can comprise a polyamide or another type of polymer based material, for example.

Insulator elements 316 additionally have bonding areas 320 for eventual bonding to a PCB or the like via solder balls or the like. In one embodiment, bonding areas 318 and 320 comprise copper patterns on insulator elements 316. Bonding areas 318 and 320 can be plated with gold or any other suitable material.

It is noteworthy that heat spreader 302 can work alone or in conjunction with another heat spreader or the like, to efficiently remove heat from semiconductor die 314 via one surface of IC package 300, while allowing for electrical connections from the opposite surface of IC package 300.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

Thus a cavity down no lead package has been described.

What is claimed is:

1. An integrated circuit ("IC") package comprising:
a mold body having first and second mold body surfaces on opposite sides of said mold body;
a leadframe disposed within said mold body;
a paddle situated substantially on said first mold body surface, said paddle having an outer paddle surface substantially exposed for dissipating heat, said paddle having an inner paddle surface for coupling to a semiconductor die;
a first portion of a plurality of leads formed against a side surface of said mold body for electrical coupling to a PCB placed against said second mold body surface.

2. The IC package of claim 1 wherein a footprint of said IC package is substantially coextensive with a footprint of said mold body.

3. The IC package of claim 1 wherein said paddle is attached to said leadframe.

4. The IC package of claim 1 wherein said outer paddle surface is coupled to an external heat spreader.

5. The IC package of claim 1 wherein said outer paddle surface is substantially flush with said first mold body surface.

6. The IC package of claim 1 wherein said outer leads protrude laterally approximately 1 millimeter from a side of said IC package.

7. The IC package of claim 1 further comprising a semiconductor die coupled to said inner paddle surface.

8. The IC package of claim 7 wherein a second portion of said plurality of leads is situated within said mold body and electrically coupled to said semiconductor die via a bond wire.

9. An integrated circuit ("IC") package comprising:
a mold body having first and second mold body surfaces on opposite sides of said mold body;
a leadframe disposed within said mold body;
a paddle situated substantially on said first mold body surface, said paddle having an outer paddle surface substantially exposed for dissipating heat, said paddle having an inner paddle surface for coupling to a semiconductor die;
a first portion of a plurality of leads formed against a side surface of said mold body for electrical coupling to a PCB placed against said second mold body surface;
a semiconductor die coupled to said inner paddle surface.

10. The IC package of claim 9 wherein a second portion of said plurality of leads is situated within said mold body and electrically coupled to said semiconductor die via a bond wire.

11. The IC package of claim 9 wherein a footprint of said IC package is substantially coextensive with a footprint of said mold body.

12. The IC package of claim 9 wherein said paddle is attached to said leadframe.

13. The IC package of claim 9 wherein said outer paddle surface is coupled to an external heat spreader.

14. The IC package of claim 9 wherein said outer paddle surface is substantially flush with said first mold body surface.

15. The IC package of claim 9 wherein said outer leads protrude laterally approximately 1 millimeter from a side of said IC package.

* * * * *